United States Patent
Lue

[19]

[11] Patent Number: 5,863,806
[45] Date of Patent: Jan. 26, 1999

[54] METHOD OF FORMING MICROCOIL STRUCTURE FOR INTEGRATED CIRCUITS

[75] Inventor: Jaw-Chyng Lue, Hsintien, Taiwan

[73] Assignee: United Microelectronics Corp., Hsinchu, Taiwan

[21] Appl. No.: 787,123

[22] Filed: Jan. 22, 1997

[30] Foreign Application Priority Data

Nov. 21, 1996 [TW] Taiwan ................................. 85114440

[51] Int. Cl.⁶ .......................... H01L 21/00; H01L 21/336
[52] U.S. Cl. ................................................ 428/3; 438/298
[58] Field of Search ............................... 438/3, 298, 449, 438/439

[56] References Cited

U.S. PATENT DOCUMENTS 5,686,327  11/1997  Park ........................................ 437/40
5,686,347  11/1997  Yang ....................................... 437/70
5,747,372  5/1998  Lim ......................................... 438/298

Primary Examiner—Joni Chang
Attorney, Agent, or Firm—Fish & Richardson P.C.

[57] ABSTRACT

A microcoil structure for use in an integrated circuit to produce magnetic flux for specific applications or to serve as an inductor is provided. Further, a method for forming the foregoing microcoil structure in a semiconductor wafer is provided. The microcoil structure includes a plurality of diffusion regions having two ends formed with ohmic contact regions. A field-oxide region and an overlaying insulating layer are formed over the diffusion regions. The field oxide region and the insulating layer together serve as a core member for the microcoil structure Further, a plurality of conductive layers are electrically connected between the diffusion regions in such a manner as to form a coil-like structure which winds around the core member to form the desired microcoil structure. When current is input to this microcoil structure, a magnetic flux is produced. The magnitude and polarity of the magnetic flux can be controlled by varying the magnitude and direction of the input current.

14 Claims, 4 Drawing Sheets

METHOD OF FORMING MICROCOIL STRUCTURE FOR INTEGRATED CIRCUITS

BACKGROUND OF THE INVENTION

1. Field of the Invention

This invention relates to integrated circuits and semiconductor fabrication processes, and more particularly, to a microcoil structure for use in an integrated circuit and a method for forming the same in a semiconductor wafer.

2. Description of Related Art

A coil is an important circuit component which can be used to produce magnetic fluxes for specific purposes or to serve as an inductor in a circuit. The magnetic flux produced by a coil increases with an increase of the input current.

Microcoil is a coil of very small size that can be incorporated in circuits or instruments of very small scale, such as in integrated circuits. It can be used to separate magnetic substances from a mixed solution, to serve as a magnetic flux producing means in tiny medical instruments, or to serve as an inductor in an integrated circuit.

SUMMARY OF THE INVENTION

It is therefore a primary objective of the present invention to provide a microcoil structure for an integrated circuit.

It is still another objective of the present invention to provide a method for forming the foregoing microcoil structure in a semiconductor wafer.

In accordance with the foregoing and other objectives of the present invention, a new microcoil structure and a method for forming the same in a semiconductor wafer are provided.

In the microcoil structure, a plurality of diffusion regions are formed on a semiconductor substrate, which are arranged substantially in parallel with each other. A plurality of first and second ohmic contact regions are formed on both sides of the diffusion regions, each first ohmic contact region being formed on a first end of one of the diffusion regions and each second ohmic contact region being formed on a second end of the one of the diffusion regions. A field-oxide region formed on the diffusion region, and an insulating layer formed on the diffusion region. Further, a plurality of conductive layers are formed on the wafer, each being formed to electrically connect between the second ohmic contact region of one of the diffusion regions and the first ohmic contact of the next diffusion region in such a manner that the diffusion region and the conductive layers are connected via the first and second ohmic contact regions to form a coil-like structure surrounding the field oxide region and the insulating layer. Finally, a protective layer is formed over the conductive layers and the insulating layer to protect the microcoil structure in the wafer.

Furthermore, a method is provided to form the foregoing microcoil structure in an integrated circuit. In this method, the first step is to prepare a semiconductor wafer, and then form a pad oxide layer on the wafer. The second step is to form a first insulating layer on the pad oxide layer. The first insulating layer is selectively removed so as to form a plurality of openings which expose selected portions of the pad oxide layer.

Subsequently, the third step is to conduct a first ion implantation process on the wafer so as to diffuse a first impurity material through the openings into the wafer to form a field oxide layer and a plurality of diffusion regions substantially arranged in parallel with each other and located beneath the field-oxide layer. The fourth step is to remove the first insulating layer. The fifth step is to form a photoresist layer on the wafer, the photoresist layer covering the field-oxide region and diffusion region and exposing regions on both sides of the field-oxide region and diffusion region. The sixth step is to conduct a second ion implantation process on the wafer so as to diffuse a second impurity material into those portions on the wafer not covered by the photoresist layer to form a plurality of first and second ohmic contact regions. Each first ohmic contact region is formed on a first end of one of the diffusion regions, and each second ohmic contact region is formed on a second end of the one of the diffusion regions.

The seventh step is to remove the photoresist layer. The eighth step is to form a second insulating layer on the pad oxide layer and the field-oxide layer, the second insulating layer being selectively removed to form a plurality of contact holes which expose the first and second ohmic contact regions. The ninth step is to form a plurality of conductive layers on the second insulating layer. Each of the conductive layers is formed to electrically connect between the second ohmic contact region of one of the diffusion regions and the first ohmic contact of the next diffusion region in such a manner that the diffusion region and the conductive layers are connected via the first and second ohmic contact regions to form a coil-like structure surrounding the field oxide region and the insulating layer. Finally, the tenth step is to form a protective layer on the conductive layers and the second insulating layer.

BRIEF DESCRIPTION OF DRAWINGS

The invention can be more fully understood by reading the following detailed description of the preferred embodiments, with reference to the accompanying drawings, wherein.

DETAILED DESCRIPTION OF PREFERRED EMBODIMENT

Figure 1:
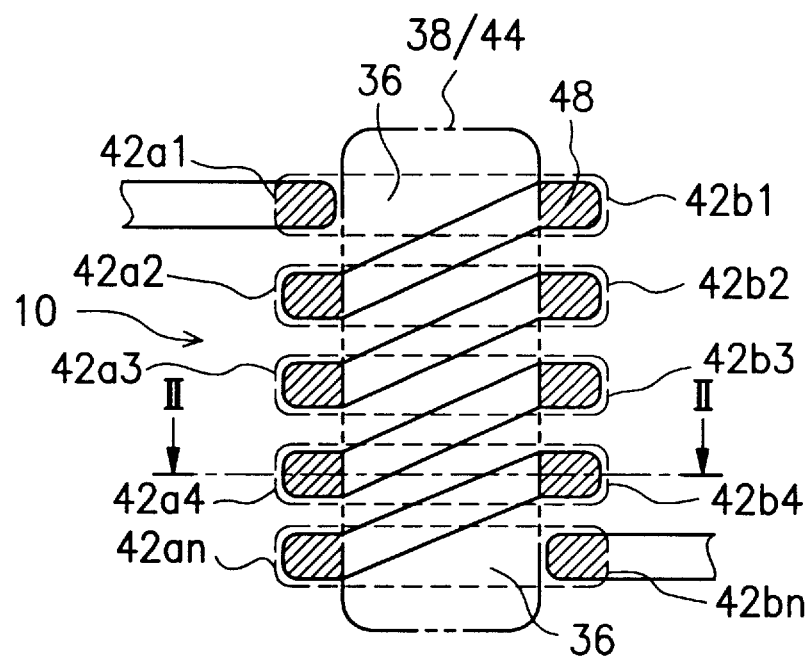
FIG. 1 is a schematic top view of a spiral microcoil structure formed in accordance with the invention.

Referring to FIG. 1, there is shown a schematic top view of a spiral microcoil structure 10 formed in accordance with the invention for producing a magnetic flux or serving as an inductor in an integrated circuit. The microcoil structure 10 includes a field-oxide region 38 and a plurality of field diffusion regions 36 arranged in parallel and spaced at equal intervals beneath the field-oxide region 38. Each of field diffusion regions 36 has one end formed with a first ohmic contact region, respectively designed by 42*a*1–42*an*, and the other end formed with a second ohmic contact region, respectively designed by 42*b*1–42*bn*.

A plurality of conductive layers 48 are used to connect between the field-diffusion regions 36 in such a manner that each of the conductive layers 48 is connected between the second ohmic contact region of one field-diffusion region 36 and the first ohmic contact region of the next one, i.e., the first conductive layer 48 is connected between 42*b*1 and 42*a*2, the second one is connected between 42*b*2 and 42*a*3, the third one is connected between 42*b*3 and 42*a*4, and so forth. The first ohmic contact region 42*a*1 of the topmost field-diffusion region and the second ohmic contact region 42bn of the bottom-most field-diffusion region are used for input of a current which can cause the microcoil structure 10 to produce a magnetic flux.

Figure 2:
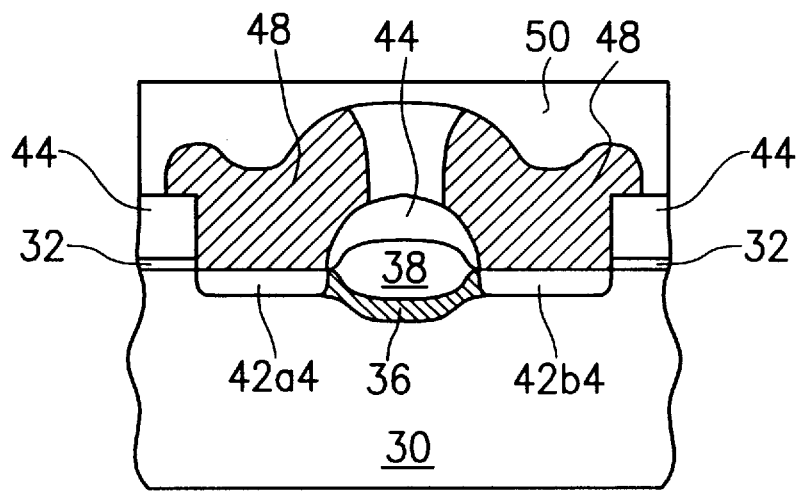
FIG. 2 is a schematic sectional view of the spiral microcoil structure of FIG. 1 cutting through the line II—II.

Referring next to FIG. 2, there is shown a schematic sectional view of the microcoil structure of FIG. 1 cutting through the line II—II. As shown, the microcoil structure 10 includes a semiconductor substrate 30 in which the above-mentioned field oxide region 38 in FIG. 1 is formed. Each of the above-mentioned field diffusion-regions 36 in FIG. 1 is formed beneath the field-oxide region 38 and has two ends connected to the first ohmic contact region 42a4 and the second ohmic contact region 42b4. Further, the abovementioned conductive layers 48 are formed over the first and second ohmic contact regions 42a4, 42b4. On the outside of the conductive layers 48, a pad oxide layer 32 and an insulating layer 44 are formed for purpose of isolation. Further, another insulating layer 44 is formed over the field-oxide region 38. A protective layer 50 is formed over the conductive layers 48 for protection of the microcoil structure 10 formed beneath.

The field oxide-region 38 and the overlaying insulating layer 44 together serve as a core member for the microcoil structure 10. The first ohmic contact region 42a4, the field-diffusion region 36 underlying the core member (38, 44), and the second ohmic contact region 42b4 in combination constitute a conductive path beneath the core member (38, 44). This conductive path and the conductive layers 48 in combination form a coil-like structure which winds around the core member (38, 44).

The procedural steps for forming the foregoing microcoil structure in a semiconductor wafer are disclosed in detail hereinbelow with reference to FIGS. 3A–3F.

Figure 3A:
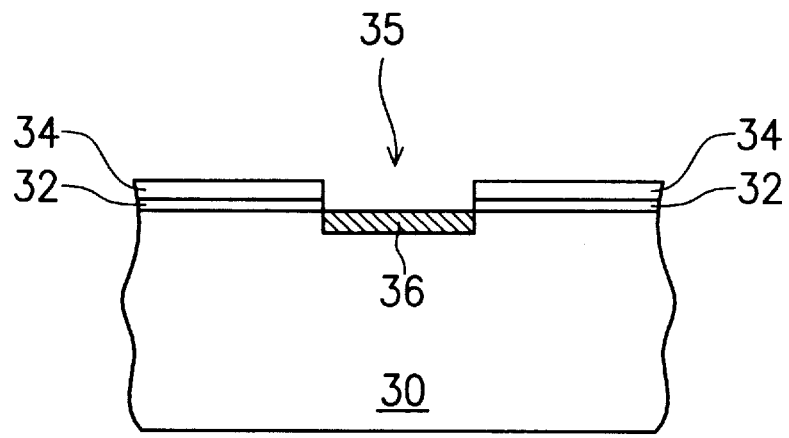
FIGS. 3A through 3F are schematic sectional diagrams used to depict the steps involved in the method of the invention for forming the microcoil structure of FIGS. 1 and 2 in a semiconductor wafer.

Referring to FIG. 3A, in the first step, a semiconductor substrate, such as a P-type silicon substrate 30 is prepared. A pad oxide layer 32, such as a silicon-dioxide layer, is formed on the silicon substrate 30 by the thermal oxidation method, for example. Subsequently, an insulating layer 34, such as a layer of silicon nitride, is formed over the pad oxide layer 32. A conventional photolithographic and etching process is then conducted on the wafer so as to form an opening 35 through the insulating layer 34 and pad oxide layer 32. An ion implantation process is then conducted on the wafer by using the insulating layer 34 as a mask so as to diffuse an N-type impurity material, such as arsenic or phosphor ions, through the opening 35 into the exposed portion of the substrate 30, thereby forming an N-type diffusion region 36 in the substrate 30. In this process, the impurity material is implanted with a concentration of $1 \times 10^{13}$ to $1 \times 10^{14}$ atoms/cm$^2$ and an energy of about 60 to 100 KeV (kiloelectronvolt), preferably 80 KeV.

Figure 3B:
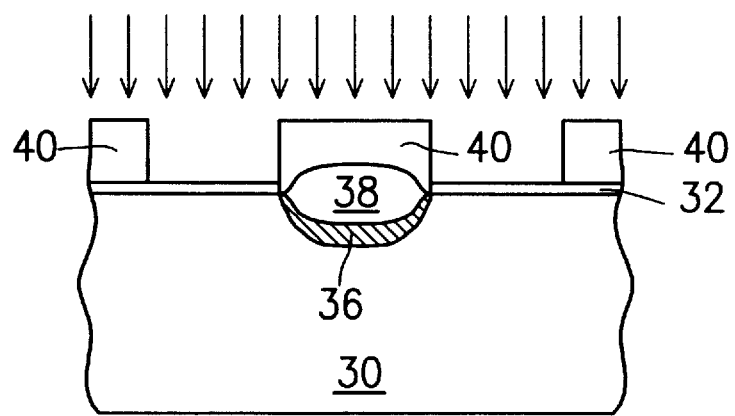

Referring next to FIG. 3B, in the subsequent step, a field-oxide layer 38 is formed by local oxidation of silicon (LOCOS) over the diffusion region 36. Through this process, the diffusion region 36 is curved downwards as illustrated in FIG. 3B. Subsequently, the insulating layer 34 is removed by a hot phosphate solution, for example. A conventional photolithographic and etching process is then conducted on the wafer to form a photoresist layer 40 which is selectively removed in part to expose those portions of the underlying substrate 30 where ohmic contact regions are to be formed. An ion implantation process is then conducted on the wafer so as to diffuse an N-type impurity material, such as phosphor or arsenic ions, into the exposed portions of the substrate 30 that are uncovered by the photoresist layer 40. In this process, the impurity material is implanted with a concentration of $1 \times 10^{13}$ to $1 \times 10^{15}$ atoms/cm$^2$ and an energy of about 60 to 100 KeV, preferably 80 KeV.

Figure 3C:
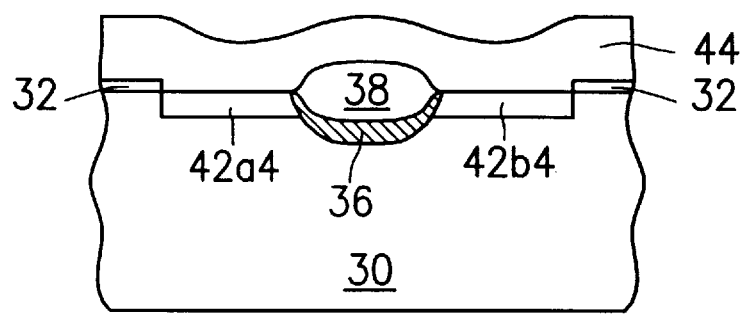

Referring further to FIG. 3C, through the ion implantation process, a plurality of 10 ohmic contact regions, i.e., the first ohmic contact regions 42a1–42an and the second ohmic contact regions 42b1–42bn shown in FIG. 1 (in this sectional diagram only 42a4 and 42b4 are shown), are formed in the substrate 30. These ohmic contact regions are electrically connected to the diffusion region 36. Subsequently, an insulating layer 44, such as a silicon-dioxide layer, is formed by chemical-vapor deposition (CVD) over the entire wafer to a thickness of about 6 K Å to 15 K Å, preferably 10 K Å.

Figure 3D:
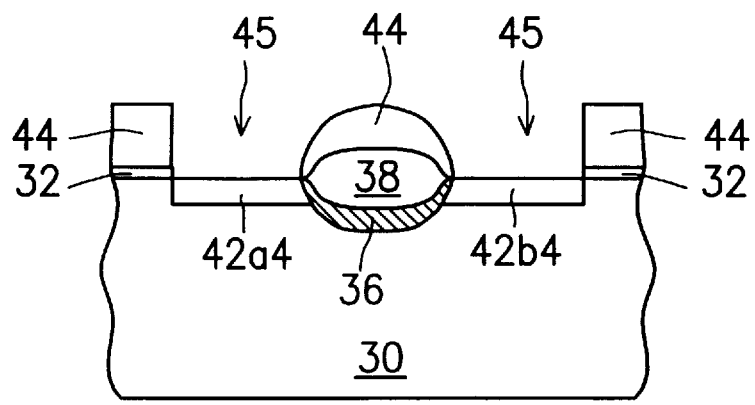

Referring next to FIG. 3D, the insulating layer 44 is selectively removed by a conventional photolithographic and etching process so as to form openings 45 which expose the ohmic contact regions (42a4 and 42b4 in FIG. 3D).

Figure 3E:
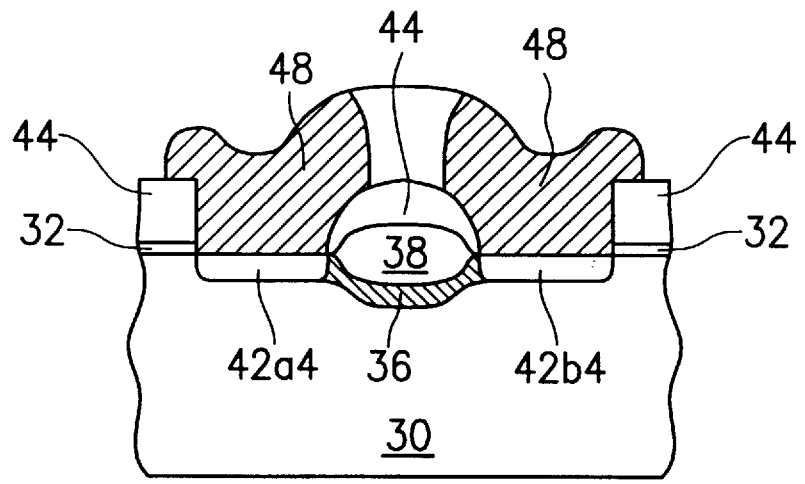

Referring further to FIG. 3E together with FIG. 1, a plurality of conductive layers 48, such as aluminum layers, are formed on selected regions on the wafer in such a manner that each conductive layer is formed to connect between the first ohmic contact region of one diffusion region 36 and the second ohmic contact region of the next one; i.e., the first conductive layer 48 is connected between 42b1 and 42a2, the second one is connected between 42b2 and 42a3, the third one is connected between 42b3 and 42a4, and so forth, as illustrated in FIG. 1.

Figure 3F:
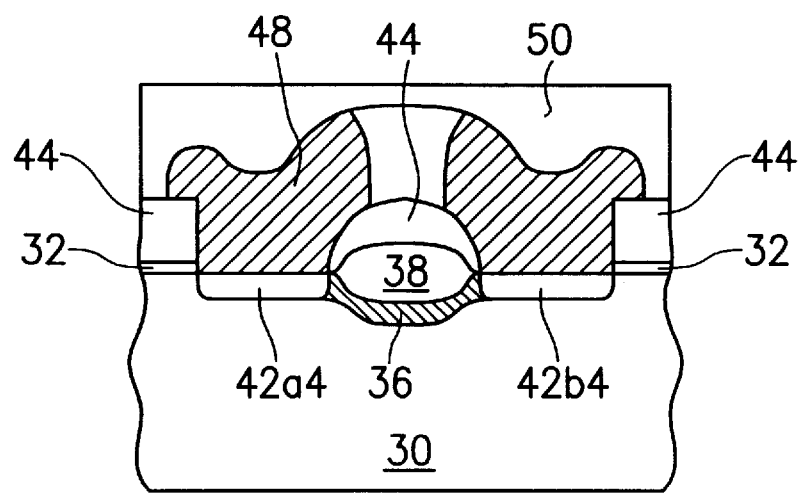

Referring finally to FIG. 3F, a protective layer 50 is formed over the entire wafer to cover the conductive layers 48 so as to protect the thus formed microcoil structure from being damaged by outside moisture, alkaline solutions, contaminants, and so on. The protective layer 50 can be made of silicon dioxide, borophosphosilicate glass (BPSG), phosphosilicate glass (PSG), silicon nitride, or $SiO_xN_x$.

In conclusion, the diffusion regions 36, the ohmic contact regions 42a1–42an, 42b1–42bn, and the conductive layers 48 are electrically connected in such a manner as to form a coil-like structure; and the field oxide region 38 and insulating layer 44 in combination serve as a core member. The coil-like structure and the core member in combination serve as the desired microcoil structure in the integrated circuit.

One advantage of the microcoil structure formed according to the invention is its small size. This microcoil structure can be used to separate magnetic substances from a mixed solution, to serve as a magnetic flux-producing means in tiny medical instruments, or to serve as an inductor in an integrated circuit.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a microcoil structure in an integrated circuit, comprising the steps of:

(1) preparing a semiconductor wafer, and then forming a pad oxide layer on said wafer;

(2) forming a first insulating layer on said pad oxide layer, said first insulating layer being selectively removed so as to form a plurality of openings which expose selected portions of the pad oxide layer;

(3) conducting a first ion implantation process on the wafer so as to diffuse a first impurity material through said openings into said wafer to form a field-oxide layer and a plurality of diffusion regions substantially arranged in parallel with each other and located beneath said field-oxide layer;

(4) removing said first insulating layer;

(5) forming a photoresist layer on said wafer, said photoresist layer covering said field-oxide region and diffusion region and exposing regions on both sides of said field-oxide region and diffusion region;

(6) conducting a second ion implantation process on the wafer so as to diffuse a second impurity material into those portions on the wafer not covered by said photoresist layer to form a plurality of first and second ohmic contact regions, each first ohmic contact region being formed on a first end of one of said diffusion regions and each second ohmic contact region being formed on a second end of said one of said diffusion regions;

(7) removing the photoresist layer;

(8) forming a second insulating layer on said pad oxide layer and said field-oxide layer, said second insulating layer being selectively removed to form a plurality of contact holes which expose said first and second ohmic contact regions;

(9) forming a plurality of conductive layers on said second insulating layer, each being formed to electrically connect between the second ohmic contact region of one of said diffusion regions and the first ohmic contact of the next diffusion region in such a manner that said diffusion region and said conductive layers being connected via said first and second ohmic contact regions to form a coil-like structure surrounding said field-oxide region and said insulating layer; and

(10) forming a protective layer on said conductive layers and said second insulating layer.

2. The method of claim 1, wherein said pad oxide layer is a layer of silicon dioxide.

3. The method of claim 1, wherein said first insulating layer is a layer of silicon nitride.

4. The method of claim 1, wherein said semiconductor wafer is P-type.

5. The method of claim 4, wherein said first impurity material is an N-type impurity material selected from the group consisting of arsenic and phosphor.

6. The method of claim 5, wherein said diffusion region is an N-type diffusion region.

7. The method of claim 6, wherein said first impurity material is implanted with a concentration of $1 \times 10^{13}$ to $1 \times 10^{14}$ atoms/cm$^2$ and an energy of about 60 to 100 KeV.

8. The method of claim 7, wherein said second impurity material is an N-type impurity material selected from the group consisting of arsenic and phosphor.

9. The method of claim 8, wherein second impurity material is implanted with a concentration of $1 \times 10^{13}$ to $1 \times 10^{15}$ atoms/cm$^2$ and an energy of about 60 to 100 KeV.

10. The method of claim 9, wherein said first and second ohmic contact regions are each an N-type region.

11. The method of claim 1, wherein said second insulating layer is a layer of silicon dioxide deposited to a thickness of about 6 K Å to 15 K Å.

12. The method of claim 4, wherein the thickness of said silicon-dioxide layer is 10 K Å.

13. The method of claim 1, wherein said plurality of conductive layers are each a layer of aluminum.

14. The method of claim 1, wherein said protective layer is made of a material selected from the group consisting of silicon dioxide, borophosphosilicate glass (BPSG), phosphosilicate glass (PSG), silicon nitride, and SiO$_x$N$_x$.

\* \* \* \* \*